(12) United States Patent
Yang et al.

(10) Patent No.: US 12,249,493 B2
(45) Date of Patent: *Mar. 11, 2025

(54) METHOD FOR MANUFACTURING SEMICONDUCTOR WAFER WITH WAFER CHUCK HAVING FLUID GUIDING STRUCTURE

(71) Applicant: TAIWAN SEMICONDUCTOR MANUFACTURING CO., LTD., Hsinchu (TW)

(72) Inventors: Sheng-Chun Yang, Tainan (TW); Yi-Ming Lin, Tainan (TW); Po-Wei Liang, Yilan County (TW); Chu-Han Hsieh, Tainan (TW); Chih-Lung Cheng, Miaoli County (TW); Po-Chih Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 63 days.

This patent is subject to a terminal disclaimer.

(21) Appl. No.: 18/172,563

(22) Filed: Feb. 22, 2023

(65) Prior Publication Data
US 2023/0197421 A1 Jun. 22, 2023

Related U.S. Application Data

(63) Continuation of application No. 16/800,220, filed on Feb. 25, 2020, now Pat. No. 11,594,401.

(51) Int. Cl.
*H01L 21/67* (2006.01)
*C23C 16/455* (2006.01)
(Continued)

(52) U.S. Cl.
CPC .. *H01J 37/32724* (2013.01); *C23C 16/45565* (2013.01); *C23C 16/45576* (2013.01);
(Continued)

(58) Field of Classification Search
None
See application file for complete search history.

(56) References Cited

U.S. PATENT DOCUMENTS

| 5,192,849 A | 3/1993 | Moslehi |
| 5,609,720 A | 3/1997 | Lenz et al. |

(Continued)

FOREIGN PATENT DOCUMENTS

| CN | 101796626 A | 8/2010 |
| JP | 2014-17393 A | 1/2014 |

(Continued)

*Primary Examiner* — Shamim Ahmed
(74) *Attorney, Agent, or Firm* — Birch, Stewart, Kolasch & Birch, LLP

(57) ABSTRACT

A method includes loading a wafer over a wafer chuck in a process chamber; performing a deposition process on the loaded wafer; supplying a fluid medium to a fluid guiding structure in the wafer chuck from a fluid inlet port on the wafer chuck, the fluid guiding structure comprising a plurality of arc-shaped channels fluidly communicated with each other; guiding the fluid medium from a first one of the arc-shaped channels of the fluid guiding structure to a second one of the arc-shaped channels of the fluid guiding structure. The second one of the arc-shaped channels of the fluid guiding structure is concentric with the first one of the arc-shaped channels of the fluid guiding structure from a top view.

20 Claims, 10 Drawing Sheets

(51) Int. Cl.
*C23C 16/46* (2006.01)
*C23C 16/505* (2006.01)
*H01J 37/32* (2006.01)
*H01L 21/683* (2006.01)

(52) U.S. Cl.
CPC .......... *C23C 16/466* (2013.01); *C23C 16/505* (2013.01); *H01L 21/67109* (2013.01); *H01L 21/6838* (2013.01); *H01J 2237/002* (2013.01); *H01J 2237/3321* (2013.01); *H01J 2237/3323* (2013.01); *H01J 2237/334* (2013.01); *H01L 21/67028* (2013.01); *H01L 21/67069* (2013.01)

(56) References Cited

U.S. PATENT DOCUMENTS

| | | |
|---|---|---|
| 9,847,222 B2 | 12/2017 | Reilly et al. |
| 10,781,518 B2 * | 9/2020 | West ................. H01J 37/32697 |
| 11,594,401 B2 * | 2/2023 | Yang ................. C23C 16/45576 |
| 2004/0187787 A1 | 9/2004 | Dawson et al. |
| 2010/0254064 A1 | 10/2010 | Miyashita et al. |
| 2011/0206843 A1 | 8/2011 | Gurary et al. |
| 2015/0118862 A1 | 4/2015 | Reilly et al. |
| 2015/0348813 A1 * | 12/2015 | Mangalore ............ H05B 6/105 219/634 |
| 2016/0276197 A1 | 9/2016 | Kim et al. |
| 2019/0304815 A1 | 10/2019 | Suzuki et al. |
| 2020/0013595 A1 | 1/2020 | Lee et al. |

FOREIGN PATENT DOCUMENTS

| | | |
|---|---|---|
| KR | 10-2010-0085907 A | 7/2010 |
| KR | 10-2017-0015382 A | 2/2017 |
| WO | WO 2018/193938 A1 | 10/2018 |

* cited by examiner

METHOD FOR MANUFACTURING SEMICONDUCTOR WAFER WITH WAFER CHUCK HAVING FLUID GUIDING STRUCTURE

The present application is a continuation application of U.S. application Ser. No. 16/800,220, filed Feb. 25, 2020, now U.S. Pat. No. 11,594,401, issued on Feb. 28, 2023, which are herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

Some process steps used in fabricating semiconductors include oxidation, diffusion, doping, annealing, etching and film deposition. Film deposition is a reactive process used to produce or deposit thin films of material on a semiconductor wafer including, but not limited to, metals, silicon dioxide, tungsten, silicon nitride, silicon oxynitride, and various dielectrics. An unsatisfactory uniformity of the film deposited on the semiconductor wafer by film deposition may adversely affect the function of the semiconductor devices.

Although existing devices and methods for producing or depositing thin films of material on the wafer have been generally adequate for their intended purposes, they have not been entirely satisfactory in all respects. Consequently, it would be desirable to provide a solution for forming the thin films for use in a wafer fabricating system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
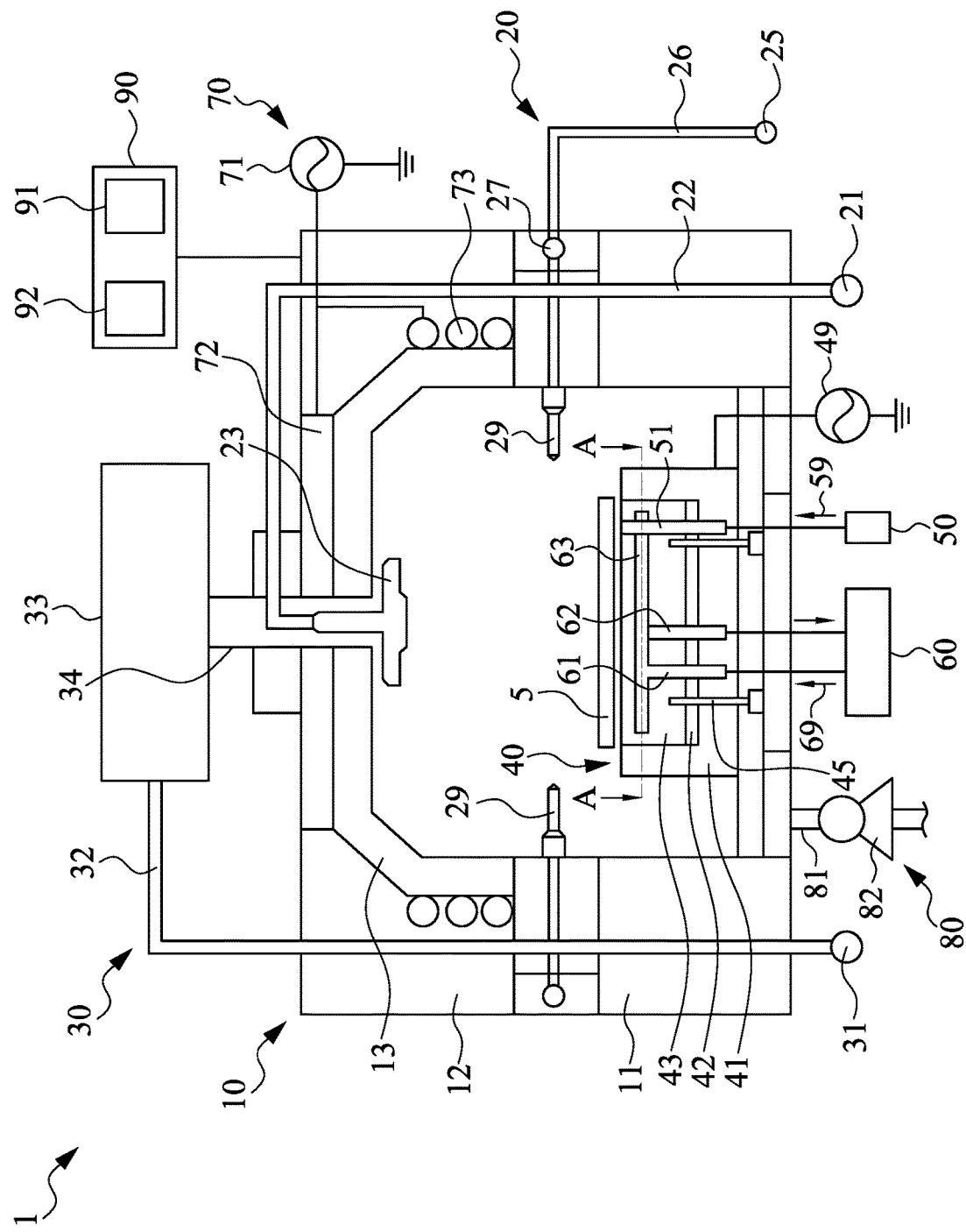
FIG. 1 shows a schematic diagram of a wafer fabricating system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor device fabrication includes many different processes. One such process is performed under an environment with high density plasma (HDP). For example, high-density plasma chemical vapor deposition (HDP-CVD) utilizes high-density plasma directed towards a semiconductor wafer in a reaction chamber to perform film deposition process. To form the high-density plasma, a gas is supplied through a number of nozzles and a power source excites gas mixture with RF or microwave power and directs the plasma ions into a dense region above the semiconductor wafer surface. The main benefit of HDP-CVD is that it can deposit films to fill high aspect ratios. However, much of the challenge for the use of high-density plasma is related not only to the controlling of a flow rate of the gas discharged by gas nozzles but also to the controlling of a wafer temperature. The increased thermal load to the semiconductor wafer may result in a high wafer temperature and cause uneven sputtering rate across the semiconductor wafer. To address this issue, embodiments of the current disclosure provide a wafer chuck having a fluid guiding structure to remove heat from the semiconductor wafer and the wafer chuck. In one example, the fluid guiding structure routes around a center of the wafer chuck in a manner that thermal accumulated on the entire area of the wafer chuck can be removed at substantially the same efficiency, so as to improve uniformity in HDP process.

FIG. 1 shows a schematic diagram of one embodiment of a wafer fabricating system 1 for processing a semiconductor wafer 5 by high density plasma, in accordance with some embodiments. The process performed in the wafer fabricating system 1 may include HDP-CVD, PECVD, etching, or sputtering processes. However, the wafer fabricating system 1 is not limited to perform above-mentioned processes and may be used wherever the semiconductor wafer 5 is processed in an elevated temperature and used a wafer chuck for cooling down temperature.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the wafer fabricating system 1 includes a chamber 10, a processing gas delivery module 20, a cleaning gas delivery module 30, a wafer holding module 40, a gas source 50, a fluid containing tank 60, a radio frequency module 70, a gas exhausting module 80, and a control module 90. Additional features can be added to the wafer fabricating system 1. Some of the features described below can be replaced or eliminated for additional embodiments of the wafer fabricating system 1.

The chamber 10 is configured to contain one or more semiconductor wafer 5 and is configured to perform a process over the semiconductor wafer 5. In some embodiments, the chamber 10 includes a lower housing 11 and an upper lid 12 hinged to the lower housing 11 and rotatable relative to the lower housing 11. In some embodiments, the upper lid 12 has a dome structure 13 formed therein. An inner wall of the lower housing 11 and the dome structure 13 respectively define a lower boundary and an upper boundary of an air-tight process region within the chamber 10 for processing the semiconductor wafer 5. The lower housing 11 and the dome structure 13 may be made of ceramic dielectric material, such as aluminum oxide or aluminum nitride.

The processing gas delivery module 20 is configured to supply processing gas into the chamber 10. In some embodiments, the processing gas delivery module 20 supplies processing gas into the chamber 10 via two different paths. For example, the processing gas delivery module 20 includes a first gas line 22 and a second gas line 26. The first gas line 22 is connected to a shower head 23 which is centrally arranged at the dome structure 13. Processing gas from a first source 21 is supplied into the chamber 10 via the first gas line 22 and the shower head 23. The second gas line 26 is connected to a gas ring 27 which circumferentially extends around a lower edge of the upper lid 12. A number of gas nozzles 29 radially extend from the gas ring 27 toward the process region within the chamber 10. Processing gas from a second source 25 is supplied into the chamber 10 via the second gas line 26, the gas ring 27 and the gas nozzles 29.

As would be understood by a person of skill in the art, while the first gas line 22 and the second gas line 26 are connected to different sources, such as first source 21 and second source 25, the actual connection of gas lines to chamber 10 varies depending on the deposition processes executed within chamber 10. The first gas line 22 and the second gas line 26 may be connected to the same source, in accordance with some other embodiments. In some embodiments, at least one of the first gas line 22 and the second gas line 26 are connected to two or more sources, and different types of source gases are mixed before injecting the gases into the chamber 10. The supply of the processing gas from the first source 21 and the first gas line 22 may be regulated by the control module 90.

The cleaning gas delivery module 30 is configured to supply cleaning gas into the chamber 10 after a process over the semiconductor wafer 5 is completed. In embodiments where flammable, toxic, or corrosive gases are used, it may be desirable to eliminate gas remaining in the chamber 10 after processing. In some embodiments, the cleaning gas delivery module 30 includes a gas line 32 connected to a gas inlet port 34 formed on a top of the upper lid 12. In some embodiments, as shown in FIG. 1, the gas inlet port 34 is arranged such that an end of the first gas line 22 is received therein and the shower head 23 is positioned overlapping a discharging end of the gas inlet port 34 and distant away from the discharging end of the gas inlet port 34. Cleaning gas from a source 31 is supplied into the chamber 10 via the gas line 32, the gas inlet port 34 and a gap between the discharging end of the gas inlet port 34 and the shower head 23. With the arrangement of the shower head 23 at the discharging end of the gas inlet port 34, the cleaning gas may be evenly distributed into the chamber 10. The cleaning gas may include molecular fluorine, nitrogen trifluoride, other fluorocarbons or equivalents.

In some embodiments, the cleaning gas delivery module 30 further includes a remote plasma generator 33. The remote plasma generator 33 excites the cleaning gas from the source 31 to a plasma and supplies the plasma to the chamber 10 via the gas inlet port 34. The remote plasma generator 33 may include a microwave generator. The remote plasma generator 33 and the gas inlet port 34 may be made of material that is resistant to attack by the plasma. The remote plasma generator 33 may be placed close to the gas inlet port 34 to avoid energy loss of the plasma. Generating the plasma in the remote plasma generator 33 allows the use of an efficient microwave generator and does not subject components in the chamber 10 to the temperature, radiation, or bombardment of the glow discharge that may be present in a plasma formed in situ. Consequently, relatively sensitive components, such as wafer holding module 40, do not need to be covered with a dummy wafer or otherwise protected, as may be required with an in situ plasma cleaning process.

The wafer holding module 40 is configured to hold the semiconductor wafer 5 during the processing. In some embodiments, the wafer holding module 40 includes a base 41, an insulator 42, a wafer chuck 43, and a number of support pins 45. In some embodiments, the base 41 is electrically connected to a radio frequency (RF) power supply 49 and acts as an electrode for regulate plasma in the chamber 10. The insulator 42 is disposed between the base 41 and the wafer chuck 43 to electrically isolate the base 41 from the wafer chuck 43. The wafer chuck 43 is configured to secure or position the semiconductor wafer 5, for example, by electrostatic force. The wafer chuck 43 may be made from an aluminum oxide or aluminum ceramic material. A thermal diode (not shown in figures) may be mounted on the wafer chuck 43 to monitor wafer temperature by detecting, for example, thermal radiation of the wafer chuck 43. The support pins 45 are configured to support the semiconductor wafer 5 when the semiconductor wafer 5 is loaded or unloaded on the wafer chuck 43 by a robot arm (not shown in figures). The support pins 45 retrack back to the wafer chuck 43 to place the semiconductor wafer 5 on a top surface of the wafer chuck 43.

Figure 2:
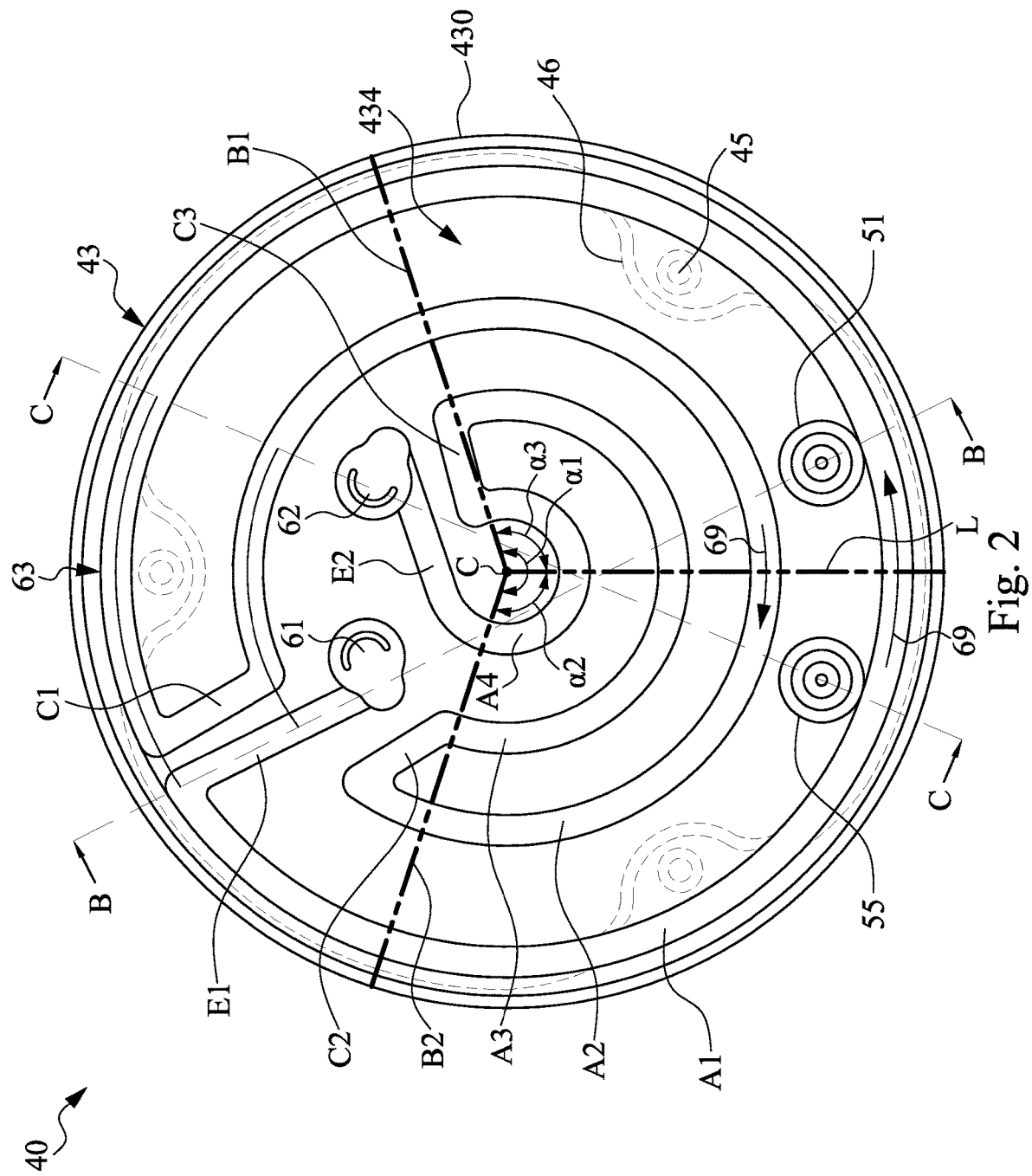
FIG. 2 shows a cross-sectional view of a wafer chuck taken along a line A-A of FIG. 1, in accordance with some embodiments.

FIG. 2 shows a cross-sectional view of the wafer chuck 43 taken along a line A-A of FIG. 1. In some embodiments, the wafer chuck 43 includes a number of inlet ports or outlet ports for engagement of pipings with the wafer chuck 43 or for facilitating ingress or egress of the fluid to the wafer chuck 43. For example, the wafer chuck 43 includes two gas inlet ports, such as first gas inlet port 51 and second inlet port 55. In addition, the wafer chuck 43 includes a fluid inlet port 61 and a fluid outlet port 62. In some embodiments, as shown in FIG. 1, the first gas inlet port 51 and the second gas inlet port 55 (only the first gas inlet port 51 is illustrated in FIG. 1) are fluidly connected to the gas source 50. Gaseous material 59, such as helium, is supplied to the wafer chuck 43 through the first gas inlet port 51 and the second gas inlet port 55. Additionally, the fluid inlet port 61 and the fluid outlet port 62 are fluidly connected to a fluid containing tank 60. Fluid medium 69, such as glycol, from the fluid containing tank 60 is supplied to a fluid guiding structure 63 formed in the wafer chuck 43 through the fluid inlet port 61 and is circulated back to the fluid containing tank 60 through the fluid outlet port 62. The fluid containing tank 60 may include a heat exchanger (not shown in figures) to cool or heat the fluid medium 69. The supply of the gaseous material from the gas source 50 and the supply of the fluid medium from the fluid containing tank 60 may be regulated by the control module 90.

Figure 3:
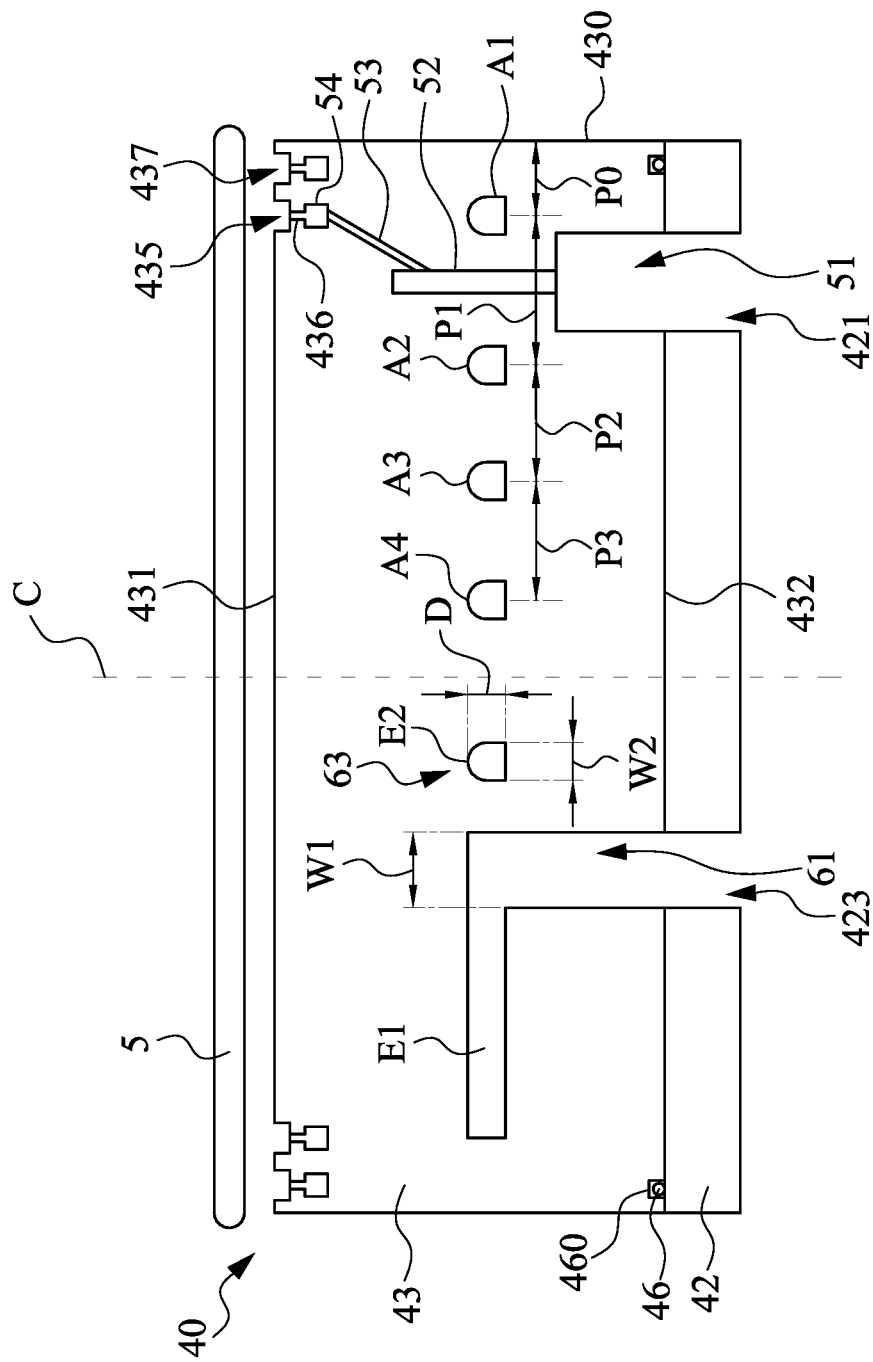
FIG. 3 shows a cross-sectional view of a wafer chuck taken along a line B-B of FIG. 2.
Figure 4:
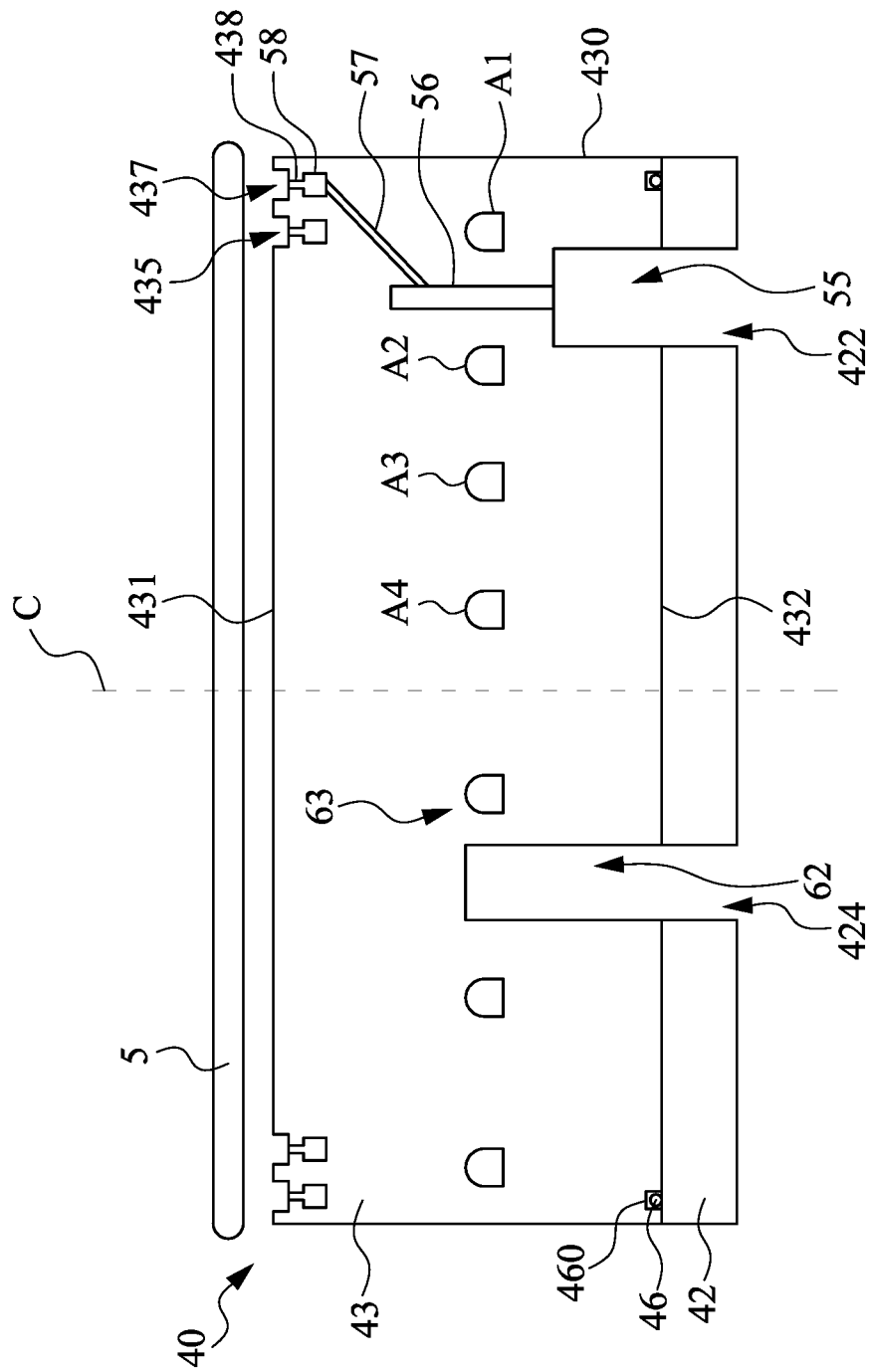
FIG. 4 shows a cross-sectional view of a wafer chuck taken along a line C-C of FIG. 2.

FIG. 3 shows a cross-sectional view of the wafer chuck 43 taken along a line B-B of FIG. 2, and FIG. 4 shows a cross-sectional view of the wafer chuck 43 taken along a line C-C of FIG. 2. In some embodiments, the wafer chuck 43 is placed on the insulator 42. An O-ring 46 is placed in an annular recess 460 formed on a bottom surface 432 of the wafer chuck 43. The O-ring 46 is configured to prevent a leakage of fluid or gas from the first gas inlet port 51 and the second gas inlet port 55, the fluid inlet port 61 and the fluid outlet port 62. The insulator 42 may also include a number of through holes, such as through holes 421-424. The through holes 421-424 are respectively connected to a lower end of the first gas inlet port 51, the second gas inlet port 55, the fluid inlet port 61 and the fluid outlet port 62 for allowing an insertion of the gas piping or fluid piping (not shown in figures) connected to the first gas inlet port 51 and the second gas inlet port 55, the fluid inlet port 61 and the fluid outlet port 62.

Structural features of the wafer chuck 43, in accordance with some embodiments of the present disclosure, are described below.

In some embodiments, as shown in FIG. 2, the two gas inlet ports 51 and 55 are located adjacent to a periphery 430 of the wafer chuck 43. A reference line L passes between the two gas inlet ports 51 and 55 and through a center C of the wafer chuck 43. The reference line L may be perpendicular to a line connecting the two gas inlet ports 51 and 55.

In some embodiments, the two gas inlet ports 51 and 55 are fluidly connected to grooves formed on a top surface of the wafer chuck 43. For example, as shown in FIG. 3, an inner annular groove 435 and an outer annular groove 437 are formed on the top surface 431 of the wafer chuck 43. The inner annular groove 435 and the outer annular groove 437 are each formed in an annular shape and arranged concentrically relative to the center C of the wafer chuck 43. The outer annular groove 437 surrounds the inner annular groove 435 and is located farther away from the center C of the wafer chuck 43 than the inner annular groove 435.

The first gas inlet port 51 may be fluidly connected to the inner annular groove 435 through a number of gas channels formed in the wafer chuck 43. For example, as shown in FIG. 3, the wafer chuck 43 includes a first lower channel 52, a first upper channel 53 and a first ring-shaped channel 54. The first lower channel 52 vertically extends in the wafer chuck 43 with a lower end connected to the first gas inlet port 51. The first ring-shaped channel 54 is formed underneath the inner annular groove 435 and fluidly connected to the inner annular groove 435 through a number of orifices 436 formed on a bottom of the inner annular groove 435. The first upper channel 53 extends inclined relative to the first lower channel 52 and connects the first lower channel 52 to the first ring-shaped channel 54. As such, when a gas piping (not shown in figures) is connected to the first gas inlet port 51, gaseous material can be discharged between the semiconductor wafer 5 and the top surface 431 of the wafer chuck 43 through the first lower channel 52, the first upper channel 53, the first ring-shaped channel 54, the orifices 436 and the inner annular groove 435.

The second gas inlet port 55 may be fluidly connected to the outer annular groove 437 through a number of gas channels formed in the wafer chuck 43. For example, as shown in FIG. 4, the wafer chuck 43 includes a second lower channel 56, a second upper channel 57 and a second ring-shaped channel 58. The second lower channel 56 vertically extends in the wafer chuck 43 with a lower end connects to the second gas inlet port 55. The second ring-shaped channel 58 is formed underneath the outer annular groove 437 and fluidly connected to the outer annular groove 437 through a number of orifices 438 formed on a bottom of the outer annular groove 437. The second upper channel 57 extends inclined relative to the second lower channel 56 and connects the second lower channel 56 to the second ring-shaped channel 58. As such, when a gas line (not shown in figures) is connected to the second gas inlet port 55, gaseous material can be discharged between the semiconductor wafer 5 and the top surface 431 of the wafer chuck 43 through the second lower channel 56, the second upper channel 57, the second ring-shaped channel 58, the orifices 438 and the outer annular groove 437.

Referring to FIG. 2, in some embodiments, the wafer chuck 43 has a fluid guiding structure 63 formed therein for guiding a flow of fluid medium in the wafer chuck 43. In some embodiments, the fluid guiding structure 63 extends in the same level of the wafer chuck 43 which is distant from a top surface 431 of the wafer chuck 43. The fluid guiding structure 63 extends from a first end channel E1 and terminates at a second end channel E2. The first end channel E1 is fluidly connected to the fluid inlet port 61, and the second end channel E2 is fluidly connected to the fluid outlet port 62. Between the first end channel E1 and the second end channel E2 are a number of arc-shaped channels, such as first arc-shaped channel A1, second arc-shaped channel A2, third arc-shaped channel A3 and fourth arc-shaped channel A4, and a number of connection channels, such as first connection channel C1, second connection channel C2 and third connection channel C3. Although FIG. 2 illustrates four arc-shaped channels and three connection channels, fluid guiding structure 63 can include any number of arc-shaped channels and connection channels. In one embodiment, the number of arc-shaped channels is less than 5.

In some embodiments, an upstream end of the first arc-shaped channel A1 is connected to a downstream end of the first end channel E1 and extends in a circumferential direction of the wafer chuck 43. An arc angle of the first arc-shaped channel A1 relative to the center C of the wafer chuck 43 is greater than 180 degrees, for example, the arc angle of the first arc-shaped channel A1 is in a range from about 330 degrees to about 355 degrees.

The second arc-shaped channel A2 is located at an inner side (i.e., a side that is closer to the center C of the wafer chuck 43) of the first arc-shaped channel A1. The second arc-shaped channel A2 extends in the circumferential direction of the wafer chuck 43. An arc angle of the second arc-shaped channel A2 may be less than the arc angle of the first arc-shaped channel A1. In one exemplary embodiment, the arc angle of the second arc-shaped channel A2 relative to the center C of the wafer chuck 43 is greater than 180 degrees, for example, the arc angle of the second arc-shaped channel A2 is in a range from about 300 degrees to about 330 degrees.

In some embodiments, as seen from the top view shown in FIG. 2, the support pins 45 are located between the first arc-shaped channel A1 and the second arc-shaped channel A2, arranged such that an interference between support pins 45 and the first arc-shaped channel A1 or the second arc-shaped channel A2 will not occur. In addition, as seen from the top view shown in FIG. 2, the first gas inlet port 51 and the second gas inlet port 55 are located between the first arc-shaped channel A1 and the second arc-shaped channel A2, arranged such that heat from regions of the wafer chuck 43 surrounding the first gas inlet port 51 and the second gas inlet port 55 can be efficiently dissipated. Details of the process for cooling the wafer chuck will be described in a method in relation to FIG. 9.

The third arc-shaped channel A3 is located at an inner side of the second arc-shaped channel A2. The third arc-shaped channel A3 extends in the circumferential direction of the wafer chuck 43. An arc angle of the third arc-shaped channel A3 may be less than the arc angle of the second arc-shaped channel A2. In one exemplary embodiment, the arc angle of the third arc-shaped channel A3 relative to the center C of the wafer chuck 43 is greater than 180 degrees, for example, the arc angle of the third arc-shaped channel A3 is in a range from about 200 degrees to about 230 degrees.

The fourth arc-shaped channel A4 is located at an inner side of the third arc-shaped channel A3. The fourth arc-shaped channel A4 extends in the circumferential direction of the wafer chuck 43. An arc angle of the fourth arc-shaped channel A4 may be greater than the arc angle of the third arc-shaped channel A3. In one exemplary embodiment, the arc angle of the fourth arc-shaped channel A4 relative to the center C of the wafer chuck 43 is greater than 180 degrees, for example, the arc angle of the fourth arc-shaped channel A4 is in a range from about 250 degrees to about 300 degrees.

The first connection channel C1 connects a downstream end of the first arc-shaped channel A1 to an upstream end of the second arc-shaped channel A2. The second connection channel C2 connects a downstream end of the second arc-shaped channel A2 to an upstream end of the third arc-shaped channel A3. The second connection channel C2 may be located immediately adjacent to the fluid inlet port 61. The third connection channel C3 connects a downstream end of the third arc-shaped channel A3 to an upstream end of the fourth arc-shaped channel A4. The third connection channel C3 may be located immediately adjacent to the fluid outlet port 62. A downstream end of the fourth arc-shaped channel A4 is connected to one end of the second end channel E2.

The first connection channel C1, the second connection channel C2 and the third connection channel C3 may extend in a direction that is parallel to a radial direction of the wafer chuck 43 or inclined relative to the radial direction of the wafer chuck 43. In the exemplary embodiment shown in FIG. 2, the first connection channel C1 extends in a direction that is substantially parallel to the radial direction of the wafer chuck 43. In such embodiment, the first connection channel C1 is perpendicular to the first arc-shaped channel A1 and the second arc-shaped channel A2.

In addition, the second connection channel C2 extend in a direction that is inclined relative to the radial direction of the wafer chuck 43. Specifically, the second connection channel C2 forms an acute angle with respect to the second arc-shaped channel A2, and the second connection channel C2 forms an obtuse angle with respect to the third arc-shaped channel A3. As such, the fluid medium may have a slower flow rate while passing through an intersection point of the second arc-shaped channel A2 and the second connection channel C2 than that of the fluid medium passing through other channels. Moreover, the fluid medium may have a faster flow rate while passing through an intersection point of the third arc-shaped channel A3 and the second connection channel C2 than that of the fluid medium passing through other channels. The third connection channel C3 may extends in the radial direction of the wafer chuck 43.

In some embodiments, for a delivery of a coolant to chill down the wafer chuck 43, the coolant in the fluid inlet port 61 may have a temperature lower than the coolant in the fluid outlet port 62. With different intersection angles of the connection channels, the fluid medium in the second connection channel C2 may be chilled down by a lower temperature generated by the fluid inlet port 61, and the fluid medium in the third connection channel C3 may not be heated up by a higher temperature generated by the fluid outlet port 62.

In some embodiments, as shown in FIG. 2, as seen from a top view, a fan-shaped sector 434 is defined on the wafer chuck 43. The fan-shaped sector 434 is a circle sector enclosed by a first boundary line B1, a second boundary line B2 and an arc located at the periphery 430 of the wafer chuck 43. The central angle $\alpha 1$ of the fan-shaped sector 434 is from about 270 degrees to about 300 degrees. The first gas inlet port 51 and the second gas inlet port 55 are located underneath the fan-shaped sector 434 of the wafer chuck 43, and the reference line L passing between the two gas inlet ports 51 and 55 forms included angles $\alpha 2$ and $\alpha 3$ with the first boundary line B1 and second boundary line B2. The angle $\alpha 2$ is equal to the angle $\alpha 3$. In one exemplary embodiment, the angles $\alpha 2$ and $\alpha 3$ are in a range from about 120 degrees to about 150 degrees.

In some embodiments, all of the channels of the fluid guiding structure 63 located underneath of the fan-shaped sector 434 of the wafer chuck 43 are formed with an arc shape and is a portion of a circle. For example, segments of each of the first arc-shaped channel A1, the second arc-shaped channel A2, the third arc-shaped channel A3 and the fourth arc-shaped channel A4 located underneath of the fan-shaped sector 434 are parts of circles with different radii.

In some embodiments, all of the channels of the fluid guiding structure 63 located underneath of the fan-shaped sector 434 of the wafer chuck 43 are concentrically arranged relative to the center C of the wafer chuck 43. For example, segments of each of the first arc-shaped channel A1, the second arc-shaped channel A2, the third arc-shaped channel A3 and the fourth arc-shaped channel A4 located underneath of the fan-shaped sector 434 are concentrically arranged relative to the center C of the wafer chuck 43.

In some embodiments, all of the channels of the fluid guiding structure 63 located underneath of the fan-shaped sector 434 of the wafer chuck 43 are symmetrically arranged relative to the reference line L passing between the two gas inlet ports 51 and 55. For example, segments of each of the first arc-shaped channel A1, the second arc-shaped channel A2, the third arc-shaped channel A3 and the fourth arc-shaped channel A4 located underneath of the fan-shaped sector 434 are symmetrically arranged relative to the reference line L passing between the two gas inlet ports 51 and 55. In other words, segments of each of the first arc-shaped channel A1, the second arc-shaped channel A2, the third arc-shaped channel A3 and the fourth arc-shaped channel A4 that are located at two sides of the reference line L have the same arc length from the reference line L to either one of the first boundary line B1 or the second boundary line B2.

In some embodiments, all of the channels not extending in the circumferential direction of the wafer chuck 43 are located outside the fan-shaped sector 434. For example, the first connection channel C1, the second connection channel C2, the third connection channel C3, the first end channel E1 and the second end channel E2 are not located underneath of the fan-shaped sector 434. In addition, the fluid inlet port 61 and the fluid outlet port 62 are located outside the fan-shaped sector 434.

In some embodiments, the first arc-shaped channel A1, the second arc-shaped channel A2, the third arc-shaped channel A3 and the fourth arc-shaped channel A4 are spaced apart from each other by different pitches. For example, as shown in FIG. 3, the first arc-shaped channel A1 is spaced apart from the second arc-shaped channel A2 by a first pitch P1, the second arc-shaped channel A2 is spaced apart from the third arc-shaped channel A3 by a second pitch P2, and the third arc-shaped channel A3 is spaced apart from the fourth arc-shaped channel A4 by a third pitch P3. The first pitch P1 is greater than the second pitch P2, and the second pitch P2 is greater than the third pitch P3. In one exemplary embodiment, the first pitch P1 is in a range from about 38 mm to about 45 mm, for example, the first pitch P1 is 42.14 mm. In one exemplary embodiment, the second pitch P2 is in a range from about 28 mm to about 35 mm, for example, the second pitch P2 is 28.84 mm. In one exemplary embodiment, the third pitch P3 is in a range from about 20 mm to about 25 mm, for example, the third pitch P3 is 23.86 mm.

In some embodiments, the outermost channel of the fluid guiding structure 63 is spaced apart from the periphery 430 of the wafer chuck 43 by a distance greater than 0. For example, as shown in FIG. 3, the first arc-shaped channel A1 is distant away from the periphery 430 of the wafer chuck 43 by a distance P0. The distance P0 is in a range from about 10 mm to about 15 mm, for example 12 mm. By arranging the first arc-shape channel A1 spaced apart from the periph-ery 430 of the wafer chuck 43, the temperature uniformity in the peripheral region of the wafer chuck 43 is improved. In some embodiments, as shown in FIG. 3, the first arc-shaped channel A1 is located underneath a vertical projection of the inner annular groove 435. As seen from the top view shown in FIG. 3, the outer annular groove 437 is closer to the periphery 430 of the wafer chuck 43 than the first arc-shaped channel A1.

In some embodiments, each of the first connection channel C1, the second connection channel C2, and the third connection channel C3 has a length that is substantially the same as the pitch between the arc-shaped channels that are connected at their two ends. For example, the first connection channel C1 has a length that is equal to the first pitch P1, the second connection channel C2 has a length that is equal to the second pitch P2, and the third connection channel C3 has a length that is equal to the third pitch P3. In other words, the length of the first connection channel C1 is greater than the length of the second connection channel C2, and the length of the second connection channel C2 is greater than the length of the third connection channel C3.

In some embodiments, since the semiconductor wafer 5 at the central region has a higher temperature than that of the peripheral region of the semiconductor wafer 5, due to the configuration of gradually increasing pitch in a direction away from the center C of the wafer chuck 43, a higher heat exchange rate is exhibited at the region nearby the center C of the wafer chuck 43 as compared to the exchange rate at the region adjacent to the periphery 430 of the wafer chuck 43.

In some embodiments, the fluid inlet port 61 has a width W1 (see FIG. 3). In one embodiment, the width W1 is in a range from about 25 mm to about 30 mm, for example, the width W1 is of about 28 mm. The fluid outlet port 62 may have the same width as the fluid inlet port 61. In some embodiments, the fluid guiding structure 63 has a uniform dimension for every channel and has a width (or diameter) that is greater than a depth. For example, as shown in FIG. 3, the second end channel E2 has a depth D in a range from about 8 mm to about 12 mm, for example, the depth D is about 8 mm; and the second end channel E2 has a width (or diameter) W2 in a range from about 8 mm to about 12 mm, for example, the width W2 is about 12 mm.

Figure 5:
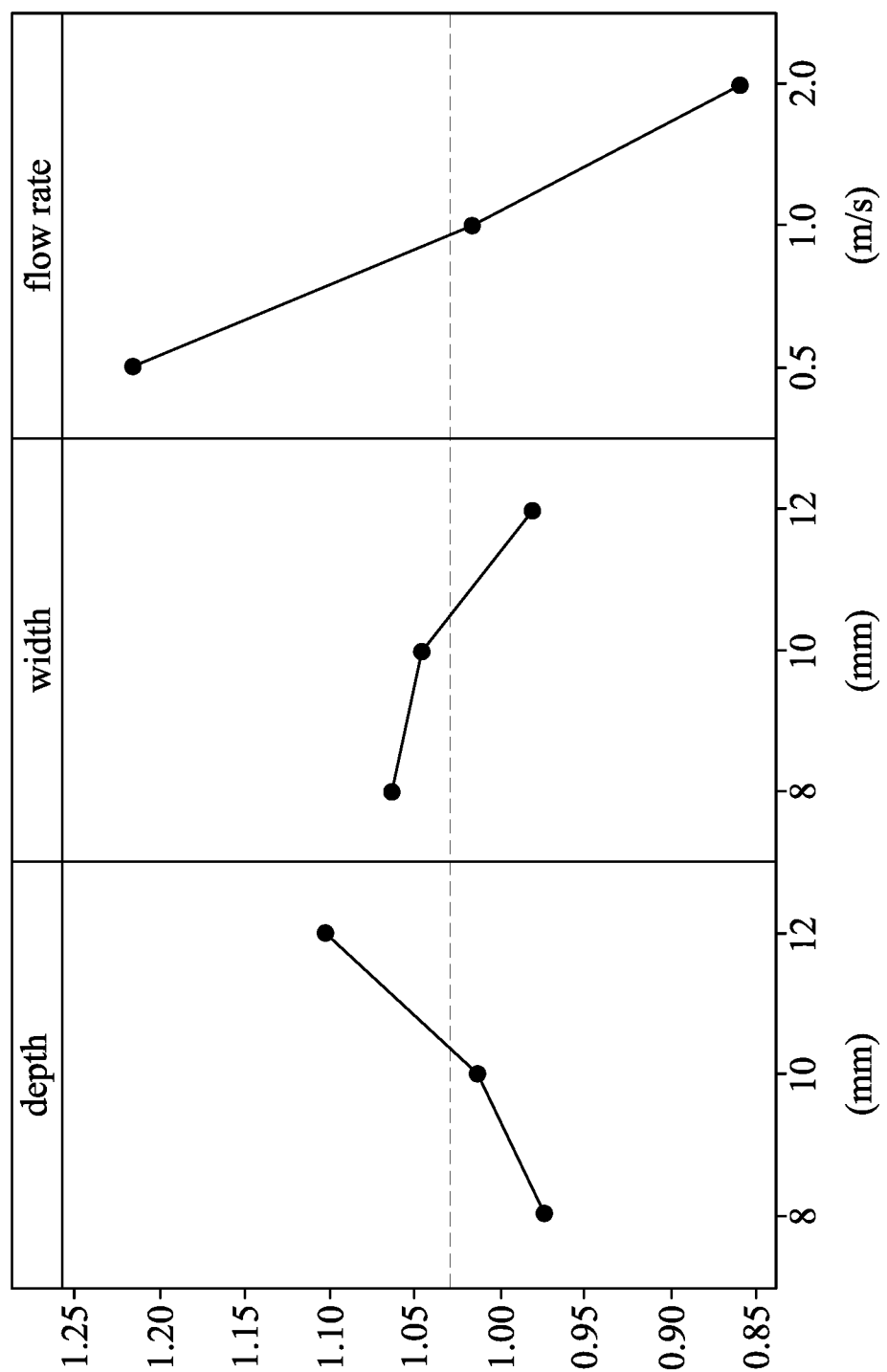
FIG. 5 shows experimental results of a film thickness uniformity in relation to different factors, in accordance with some embodiments.

According to an experimental result, as shown in FIG. 5, with a channel having a depth D of about 8 mm and a width W2 of about 12 mm, the smallest film thickness uniformity is exhibited. The film thickness uniformity satisfies the following equation:

$$(T_{Max} - T_{Min})/2 * T_{avg} * 100\%$$

Where $T_{Max}$ is a maximum thickness measured on the wafer surface, $T_{Min}$ is a minimum thickness measured on the wafer surface, and $T_{avg}$ is an average thickness measured on the wafer surface. Lower film thickness uniformity may demonstrate a better performance of semiconductor devices.

Figure 6:
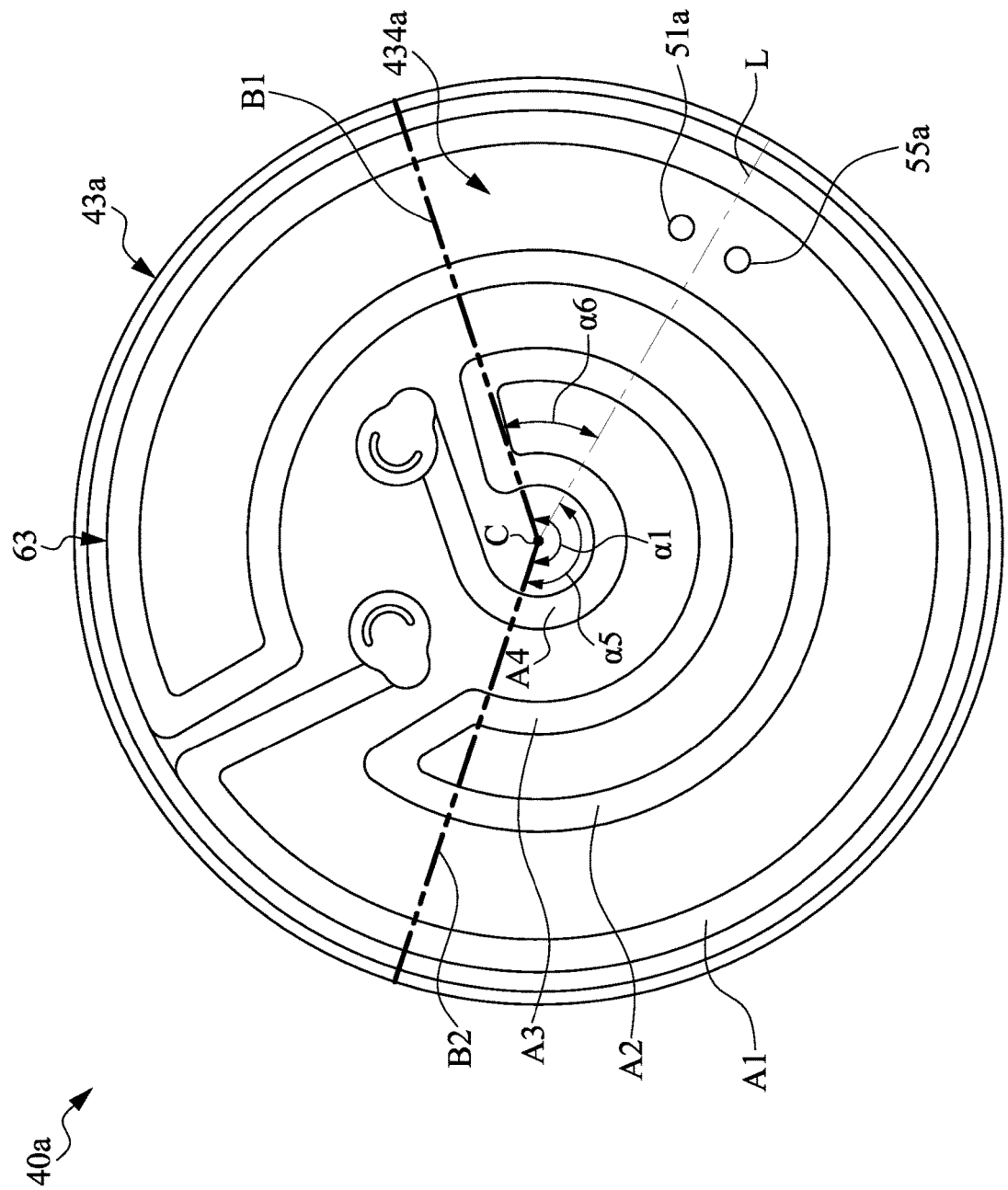
FIG. 6 shows a cross-sectional view of a wafer chuck, in accordance with some embodiments.

FIG. 6 shows a cross-sectional view of a wafer holding module 40a, in accordance with some embodiments. The wafer holding module 40a is similar to the wafer holding module 40 shown in FIG. 2 and like components have like reference numbers. Differences between the wafer holding module 40a and the wafer holding module 40 includes the wafer holding module 40a replacing the two gas inlet ports 51 and 55 with two gas inlet ports 51a and 55a.

In some embodiments, the gas inlet port 51a and the gas inlet port 55a are located adjacent to a periphery 430a of the wafer chuck 43a. A reference line L passes between the two gas inlet ports 51a and 55a and through the center C of the wafer chuck 43. The reference line L may be perpendicular to a line connecting the two inlet ports 51a and 55a. In some embodiments, the two gas inlet ports 51a and 55a are fluidly connected to grooves, such as inner annular groove 435 and outer annular groove 437 shown in FIG. 3, formed on a top surface of the wafer chuck 43. The gas inlet ports 51a and 55a are located underneath the fan-shaped sector 434a of the wafer chuck 43a, and the reference line L passing between the gas inlet ports 51a and 55a forms included angles $\alpha 5$ and $\alpha 6$ with the first boundary line B1 and second boundary line B2. The angle $\alpha 5$ is different from the angle $\alpha 6$. In one exemplary embodiment, the angles $\alpha 5$ is in a range from about 120 degrees to about 150 degrees, and the angle $\alpha 6$ is in a range from about 30 degrees to about 60 degrees.

In the embodiment shown in FIG. 6, segments of each of the first arc-shaped channel A1, the second arc-shaped channel A2, the third arc-shaped channel A3 and the fourth arc-shaped channel A4 located underneath of the fan-shaped sector 434a are asymmetrically arranged relative to the reference line L passing between the gas inlet ports 51a and 55a. In other words, segments of each of the first arc-shaped channel A1, the second arc-shaped channel A2, the third arc-shaped channel A3 and the fourth arc-shaped channel A4 that are located at two sides of the reference line L have different arc lengths from the reference line L to the first boundary line B1 or from the reference line L to the second boundary line B2.

Figure 7:
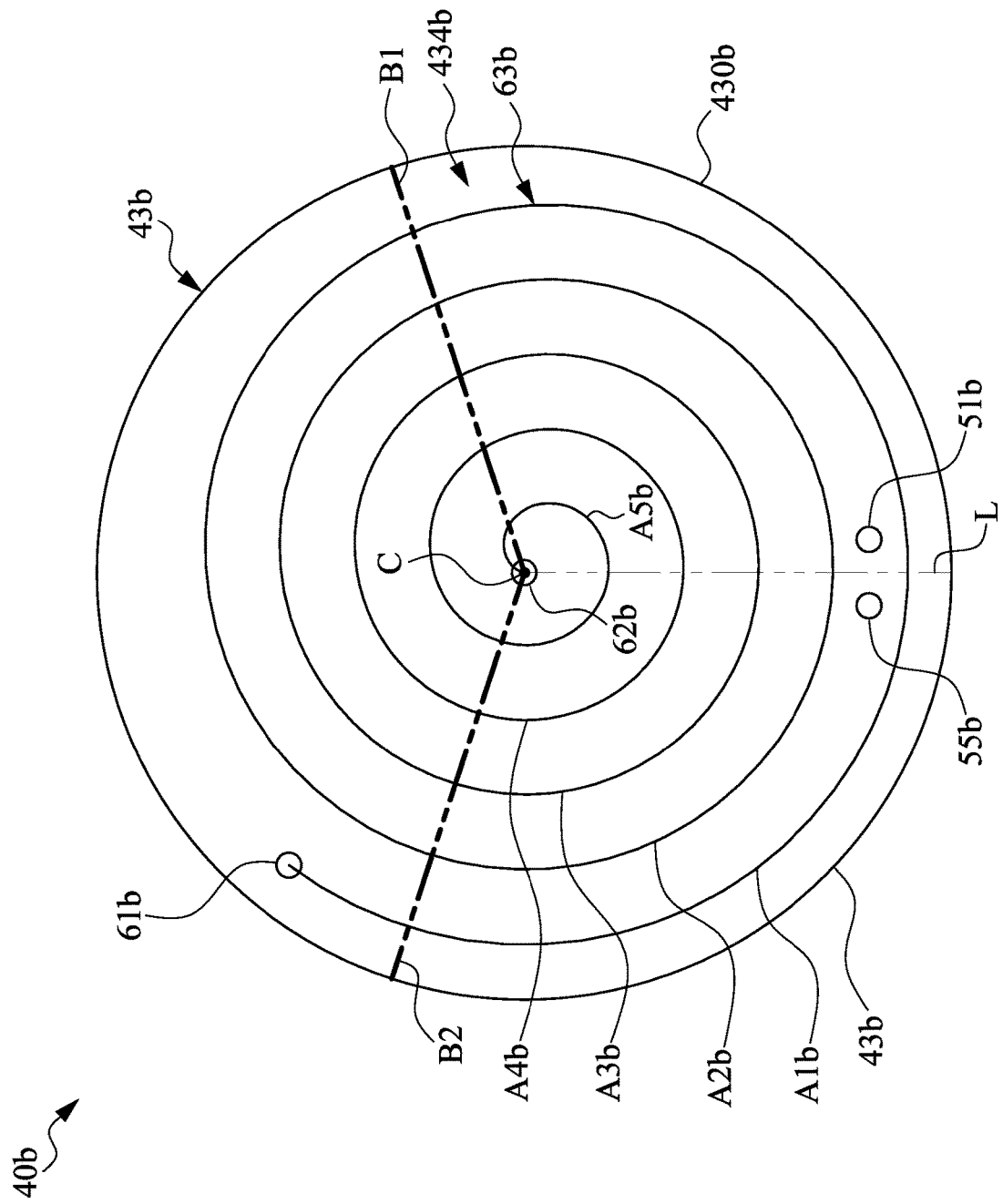
FIG. 7 shows a cross-sectional view of a wafer chuck, in accordance with some embodiments.

FIG. 7 shows a cross-sectional view of a wafer holding module 40b, in accordance with some embodiments. The wafer holding module 40b is similar to the wafer holding module 40 shown in FIG. 2 and like components have like reference numbers. Differences between the wafer holding module 40b and the wafer holding module 40 includes the wafer holding module 40b replacing the fluid guiding structure 63 with fluid guiding structure 63b and replacing the fluid inlet port 61 and the fluid outlet port 62 with a fluid inlet port 61b and a fluid outlet port 62b.

The fluid inlet port 61b is located adjacent to a periphery 430b of the wafer chuck 43b, and the fluid outlet port 62b is located at a center C of the wafer chuck 43b. In some embodiments, the fluid guiding structure 63b is formed with a spiral shape and includes a number of arc-shape channels, such as first arc-shaped channel A1b, second arc-shaped channel A2b, third arc-shaped channel A3b, fourth arc-shaped channel A4b and fifth arc-shaped channel A5b. An upstream end of the first arc-shaped channel A1b is connected to the fluid inlet port 61b and a downstream end of the fifth arc-shaped channel A5b is connected to the fluid outlet port 62b. The second arc-shaped channel A2b, the third arc-shaped channel A3b, the fourth arc-shaped channel A4b consecutively extend from the first arc-shaped channel A1b to the fifth arc-shaped channel A5b.

In some embodiments, each of the first arc-shaped channel A1b, the second arc-shaped channel A2b, the third arc-shaped channel A3b, the fourth arc-shaped channel A4b, and the fifth arc-shaped channel A5b has a central angle of about 360 degrees. In addition, segments of each of the first arc-shaped channel A1b, the second arc-shaped channel A2b, the third arc-shaped channel A3b, the fourth arc-shaped channel A4b, and the fifth arc-shaped channel A5b located underneath of the fan-shaped sector 434b of the wafer chuck 43b are formed with arc shape. Moreover, segments of each of the first arc-shaped channel A1b, the second arc-shaped channel A2b, the third arc-shaped channel A3b, the fourth arc-shaped channel A4b, and the fifth arc-shaped channel A5b located underneath of the fan-shaped sector 434b of the wafer chuck 43b are asymmetrically arranged relative to the reference line L passing between gas inlet ports 51b and 55b. The gas inlet ports 51b and 55b may have similar configuration as the two gas inlet ports 51 and 55.

Figure 8:
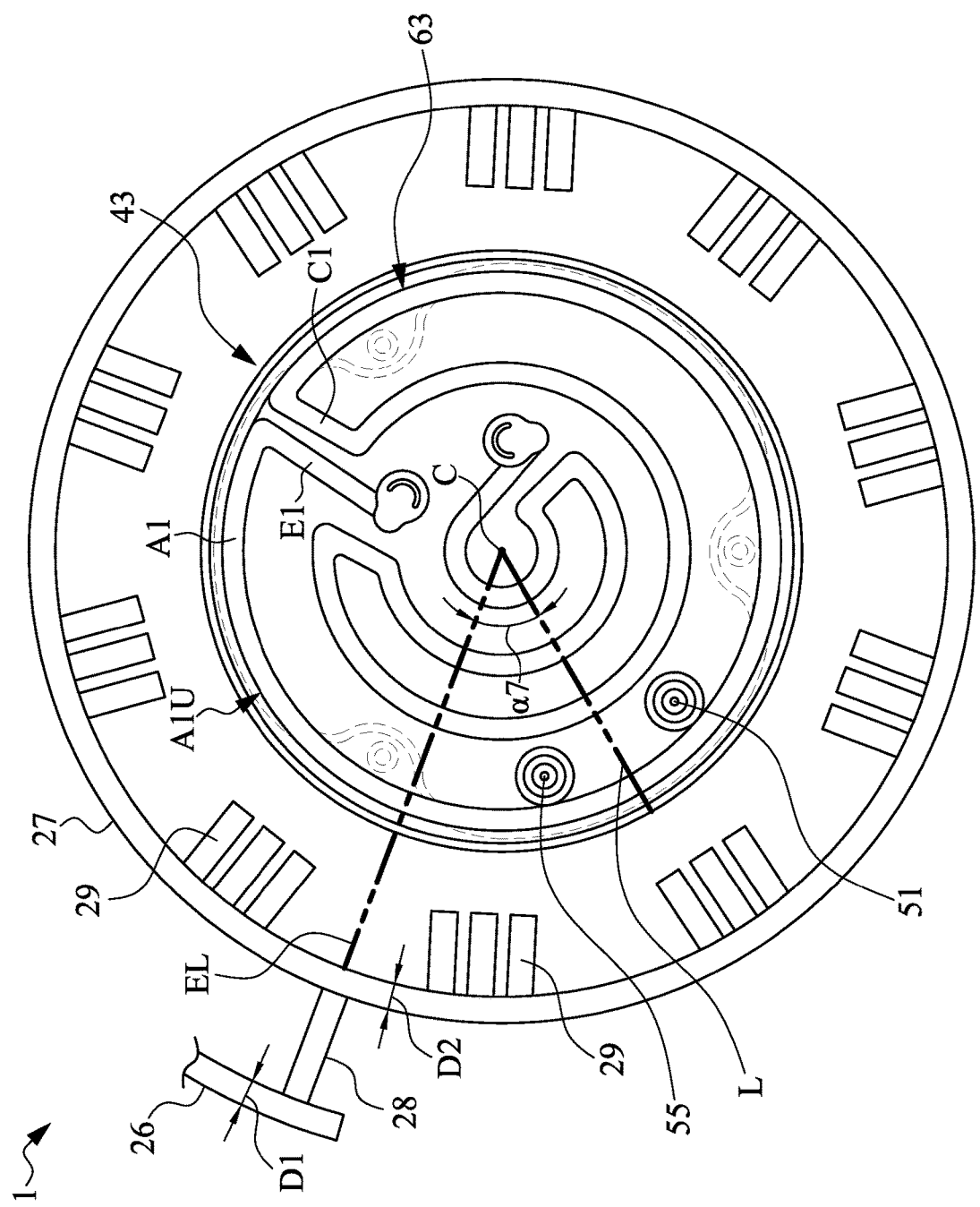
FIG. 8 shows a top view of partial elements of a wafer fabricating system, in accordance with some embodiments.

FIG. 8 shows a top view of partial elements of a wafer fabricating system, in accordance with some embodiments. In some embodiments, the second gas line 26 includes an end segment concentrically arranged with the gas ring 27 relative to the center C of the wafer chuck 43, and the second gas line 26 is connected to the gas ring 27 through a tube 28. The end segment of the second gas line 26 has a width D1 and the gas ring 27 has a width D2. In some embodiments, the width D1 is different from the width D2. For example, the width D1 is of about 10 mm and the width D2 is of about 12 mm, which significantly improves velocity uniformity of the processing gas supplied from the gas nozzles 29.

In some embodiments, as shown in FIG. 8, an extension line EL of the tube 28 passes through the center C of the wafer chuck 43. An included angle $\alpha 7$ of the extension line EL and the reference line L between the two gas inlet ports 51 and 55 is of about 30 degrees to about 50 degrees. In some embodiments, the gas nozzles 29 located closer to the tube 28 supply processing gas at a higher velocity as compared to other gas nozzles 29 away from the tube 28. Difference in the velocity of the processing gas may lead to an uneven thickness uniformity. However, since an upstream segment A1U of the first arc-shape channel A1, which conveys cooling medium just entering the fluid guiding structure 63, is located adjacent to the tube 28, a region of the semiconductor wafer 5 located above the upstream segment A1U of the first arc-shaped channel A1 may have a temperature slightly lower than temperature in other regions. As a result, a film growing rate is optimally regulated and film thickness uniformity is improved.

Referring to FIG. 1, in some embodiments, the radio frequency module 70 is configured to generate RF fields so as to excite plasma in the chamber 10. In some embodiments, the radio frequency module 70 includes a source radio frequency 71, a top electrode 72 and a number of inductive coils 73. The source radio frequency 71 may be connected to the control module 90. The control module 90 is operable to modulate the power output of the source radio frequency 71 and to deliver the right amount of power to the top electrode 72 and the inductive coils 73 for plasma generation. The wafer chuck 43 is also RF-biased by an RF power supply 49. The RF power supply 49 may be connected to the control module 90. The control module 90 is operable to modulate the power output of the RF power supply 49 and to deliver the appropriate amount of power to the wafer chuck 43.

The gas exhausting module 80 is configured to remove the gaseous materials or plasma in the chamber 10. In some embodiments, the gas exhausting module 80 includes an exhaust conduit 81 and a pump 82. The exhaust conduit 81 is connected to the lower portion of the chamber 10. The exhaust conduit 81 may be made of quartz, SiC, Si or any other suitable material commonly used in the art. The pump 82 is connected to the exhaust conduit 81 and configured to create the exhaust flow from the chamber 10. The flow rate of the exhaust flow in the exhaust conduit 81 may be adjusted by controlling the output power of the pump 82 according to a control signal issued from the control module 90. The pump 82 may include, but is not limited to, a turbo-molecular pump.

The control module 90 controls and directs the fabrication tools, such as the chamber 10, the processing gas delivery module 20, the cleaning gas delivery module 30, the radio frequency module 70, and the gas exhausting module 80 to start and stop various processes involved in the film deposition process. The control module 90 also controls the supply of the gaseous material from the gas source 50 and the supply of the fluid medium from the fluid containing tank 60.

In some embodiments, the control module 90 includes a processor 91 and a memory 92. The processor 91 is arranged to execute and/or interpret one or more set of instructions stored in the memory 92. In some embodiments, the processor 91 is a central processing unit (CPU), a multi-processor, a distributed processing system, an application specific integrated circuit (ASIC), and/or a suitable processing unit. The memory 92 includes a random access memory or other dynamic storage device for storing data and/or instructions for execution by the processor 91. In some embodiments, the memory 92 is used for storing temporary variables or other intermediate information during execution of instructions to be executed by the processor 91. In some embodiments, the memory 92 also includes a read-only memory or other static storage device for storing static information and instructions for the processor 91. In some embodiments, the memory 92 is an electronic, magnetic, optical, electromagnetic, infrared, and/or a semiconductor system (or apparatus or device). For example, the memory 92 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 92 includes a compact disk-read only memory (CD-ROM), a compact disk-read/write (CD-R/W), and/or a digital video disc (DVD).

Figure 9:
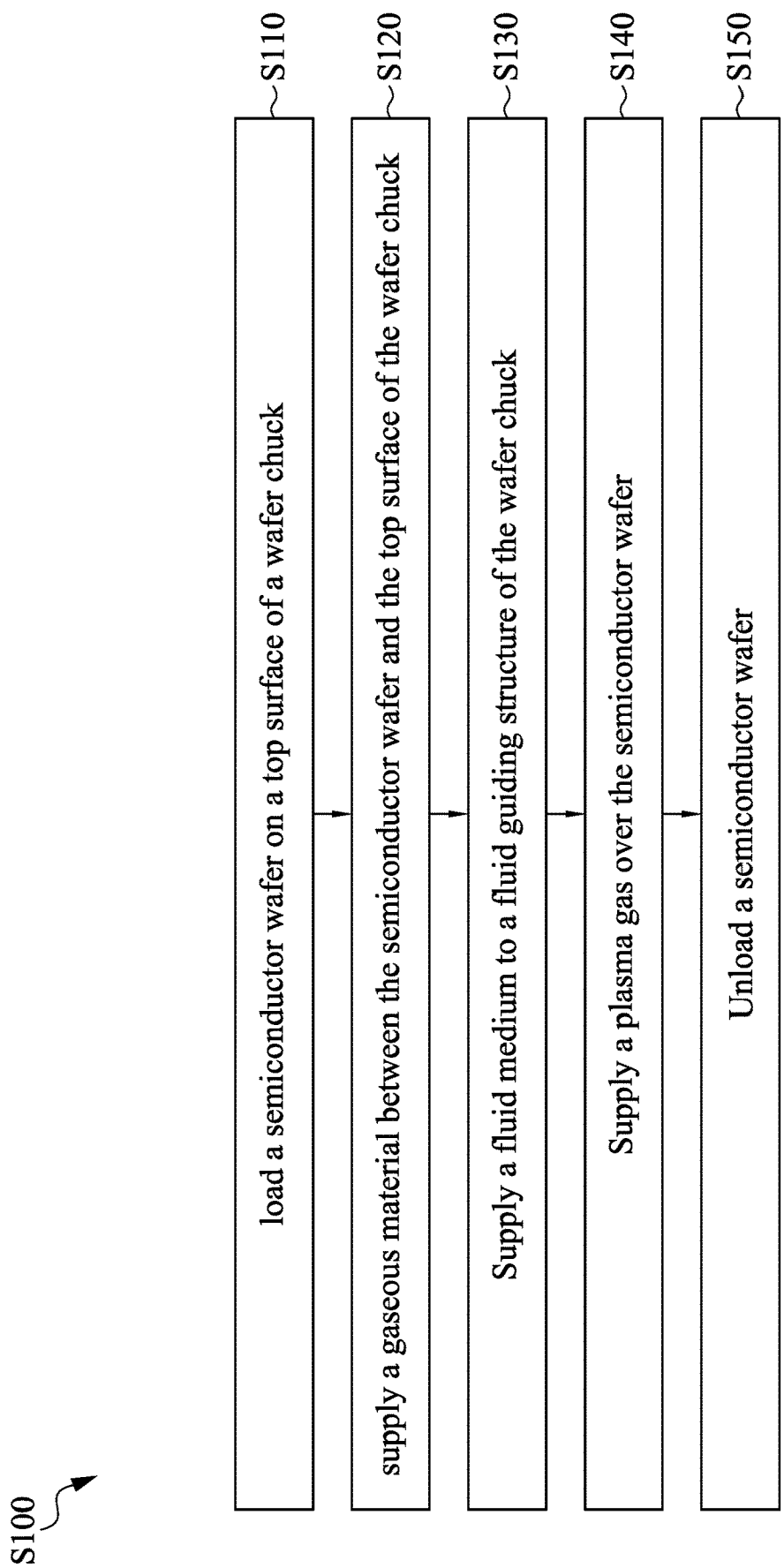
FIG. 9 shows a flow chart illustrating a method for processing a semiconductor wafer in a wafer fabricating system, in accordance with some embodiments.

FIG. 9 is a flow chart illustrating a method S100 for processing semiconductor wafers 5, in accordance with some embodiments. For illustration, the flow chart will be described along with the drawings shown in FIGS. 1-8 and 10. Additional operations can be provided before, during, and after the method S100, and some of the operations described can be replaced or eliminated for other embodiments of the method.

The method S100 begins with operation S110, in which the semiconductor wafer 5 is loaded on the top surface 431 of the wafer chuck 43. In some embodiments, the semiconductor wafer 5 is moved into the chamber 10 by a robot arm (not shown in figures). The robot arm places the semiconductor wafer 5 on the support pins 45 and moves outside of the chamber 200. After the semiconductor wafer 5 is placed on the support pins 45, the support pins 45 lower the semiconductor wafer 5, and then the semiconductor wafer 5 is fixed by the wafer chuck 43, as shown in FIG. 10.

The method S100 also includes operation S120, in which a gaseous material is supplied between the semiconductor wafer 5 and the top surface 431 of the wafer chuck 43. In some embodiments, the gaseous material is supplied to the wafer chuck 43 via one or more gas pipings that are connected to the first gas inlet port 51 and the second gas inlet port 55. The gaseous material 59 from the first gas inlet port 51 may be delivered to the inner annular groove 435 through gas channels, such as first lower channel 52, first upper channel 53, first ring-shaped channel 54 and orifices 436, shown in FIG. 3. In addition, the gaseous material 59 from the second gas inlet port 55 may be supplied into the outer annular groove 437 through gas channels, such as second lower channel 56, second upper channel 57, second ring-shaped channel 58 and orifices 438, shown in FIG. 4.

Figure 10:
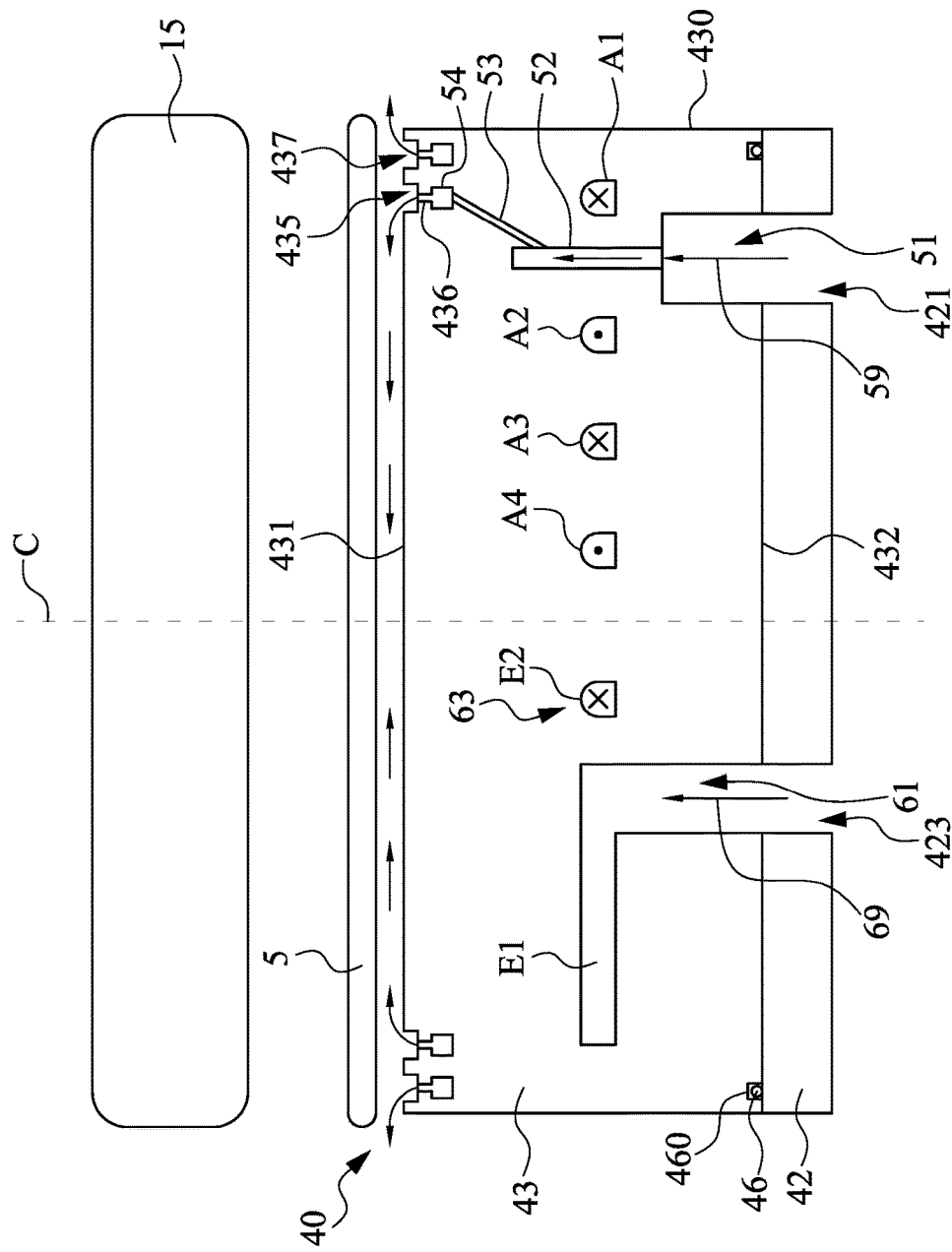
FIG. 10 shows a schematic view of a stage of a method of forming a film on a semiconductor wafer in which a fluid medium and a gaseous material are supplied into a wafer chuck, in accordance with some embodiments.

As shown in FIG. 10, the gaseous material 59 filled in the inner annular groove 435 and the outer annular groove 437 will continue flowing into a gap formed between the semiconductor wafer 5 and the top surface 431 of the wafer chuck 43. Most of the gaseous material 59 from the inner annular groove 435 is trapped between the semiconductor wafer 5 and the top surface 431 of the wafer chuck 43 by the gaseous material 59 from the outer annular groove 437. Therefore, a gas film is formed between the semiconductor wafer 5 and top surface 431 of the wafer chuck 43 and acts as a heat-transfer medium between the semiconductor wafer 5 and the wafer chuck 43. In some embodiments, the gaseous material 59 include a gas having a relative high thermal conductivity, such as helium.

The method S100 also includes operation S130, in which a fluid medium is supplied to the fluid guiding structure 63 of the wafer chuck 43. In some embodiments, a fluid medium 69, such as glycol, is delivered to the fluid guiding structure 63 for cooling the wafer chuck 43. In some embodiments, the fluid medium 69 is supplied into the fluid guiding structure 63 at a flow rate in a range from about 0.5 m/s to about 2.0 m/s. According to an experimental result, as shown in FIG. 5, in the condition that the fluid medium 69 is controlled to have a flow rate of about 2.0 m/s, the smallest film thickness uniformity is exhibited.

In some embodiments, the fluid medium 69 is supplied into the fluid guiding structure 63 via a piping connected to the fluid inlet port 61. After the fluid medium 69 enters the fluid guiding structure 63, the fluid medium 69 may sequentially flow through the first end channel E1, the first arc-shaped channel A1, the first connection channel C1, the second arc-shaped channel A2, the second connection channel C2, the third arc-shaped channel A3, the third connection channel C3, the fourth arc-shaped channel A4 and the second end channel E2. The fluid medium 69 is then removed from the fluid guiding structure 63 via another piping connected to the fluid outlet port 62.

In some embodiments, the fluid medium 69 is guided by two arc-shaped channels which are located at two sides of the first gas inlet port 51 and the second gas inlet port 55, and the fluid medium 69 flows through the two arc-shaped channels in opposite circumferential directions around the center C of the wafer chuck 43. For example, as shown in FIG. 10, the fluid medium 69 in the first arc-shaped channel A1 flows in a counter-clockwise direction (designated as "X") relative to the center C of the wafer chuck 43, and the fluid medium 69 in the second arc-shaped channel A2 flows in a clockwise direction (designated as "⸺") relative to the center C of the wafer chuck 43. The fluid medium 69 flows through the first arc-shaped channel A1 and the second arc-shaped channel A2 in opposite circumferential directions around the center C of the wafer chuck 43. With such arrangement, the heat in the fan-shaped sector 434 of the wafer chuck 43 can be removed efficiently. In addition, the fluid medium 69 in the third arc-shaped channel A3 flows in a clockwise direction (designated as "X") relative to the center C of the wafer chuck 43, and the fluid medium 69 in the fourth arc-shaped channel A4 flows in a counter-clockwise direction (designated as "⸺") relative to the center C of the wafer chuck 43. The fluid medium 69 flows through the third arc-shaped channel A3 and the fourth arc-shaped channel A4 in opposite circumferential directions around the center C of the wafer chuck 43.

In some embodiments, the fluid medium 69 is guided by the arc-shaped channels that are symmetrical about the reference line L passing between the first gas inlet port 51 and the second gas inlet port 55. For example, the fluid medium 69 is guided by the first arc-shaped channel A1, the second arc-shaped channel A2, the third arc-shaped channel A3 and the fourth arc-shaped channel A4 which are symmetrical about the reference line L passing through between the first gas inlet port 51 and the second gas inlet port 55, as shown in FIG. 2. However, it will be appreciated that many variations and modifications can be made to embodiments of the disclosure. In some embodiments, the fluid medium 69 is guided by the arc-shaped channels that are asymmetrical about a reference line L passing between the first gas inlet port 51 and the second gas inlet port 55. For example, the fluid medium 69 is guided by the first arc-shaped channel A1, the second arc-shaped channel A2, the third arc-shaped channel A3 and the fourth arc-shaped channel A4 which are asymmetrical about the reference line L passing between the first gas inlet port 51a and the second gas inlet port 55a, as shown in FIG. 5. By arranging two arc-shape channels passing through two opposite sides of the gas inlet ports, heat from a portion of the wafer chuck 43 that is located around the gas inlet ports can be evenly dissipated by both two neighboring arc-shaped channels.

In some embodiments, the fluid medium 69 is guided by the arc-shaped channels that are concentrically arranged relative to the center C of the wafer chuck 43. For example, the fluid medium 69 is guided by the first arc-shaped channel A1, the second arc-shaped channel A2, the third arc-shaped channel A3 and the fourth arc-shaped channel A4 which are concentrically arranged relative to the center C of the wafer chuck 43, as shown in FIG. 2. Since the arc-shaped channels are concentrically arranged, heat from a portion of the wafer chuck 43 that is located between two arc-shaped channels can be evenly dissipated by both neighboring arc-shaped channels. As a result, a uniform temperature distribution is exhibited on the semiconductor wafer 5.

In some embodiments, the fluid medium 69 is guided by the arc-shaped channels that are concentrically arranged relative to the center C of the wafer chuck 43. For example, the fluid medium 69 is guided by the first arc-shaped channel A1, the second arc-shaped channel A2, the third arc-shaped channel A3 and the fourth arc-shaped channel A4, as shown in FIG. 2. The arc angle of the first arc-shaped channel A1 is in a range from about 330 degrees to about 355 degrees, the arc angle of the second arc-shaped channel A2 is in a range from about 300 degrees to about 330 degrees, the arc angle of the third arc-shaped channel A3 is in a range from about 200 degrees to about 230 degrees, and the arc angle of the fourth arc-shaped channel A4 is in a range from about 250 degrees to about 300 degrees. Since the arc-shaped channels extend through most of the area of the wafer chuck 43, the temperature in the wafer chuck 43 can be accurately regulated.

In some embodiments, the fluid medium 69 is guided by one of the arc-shaped channels that is located underneath a vertical projection of the inner annular groove 435. For example, as shown in FIG. 10, the fluid medium 69 is guided by the first arc-shape channel A1, and the first arc-shape channel A1 is located underneath a vertical projection of the inner annular groove 435.

In some embodiments, the fluid medium 69 from the fluid inlet port 61 first flows through an arc-shaped channel that is farthest away from the center C of the wafer chuck 43 and flows to another arc-shaped channel that is located closer to the center C of the wafer chuck 43. For example, the fluid medium 69 from the fluid inlet port 61 flows through the first arc-shaped channel A1 prior to the second arc-shaped channel A2.

The method S100 also includes operation S140, in which a plasma gas is supplied over the semiconductor wafer 5. In some embodiments, the RF power is applied to the dome structure 13 and the wafer chuck 43 by the radio frequency module 70 and the RF power supply 49, and the plasma is excited between the dome structure 13 and the wafer chuck 43. In some embodiments, as shown in FIG. 10, the plasma gas 15 is directed toward the semiconductor wafer 5 so as to form a thin film on the semiconductor wafer 5 in a HDP-CVD process, or recess a material formed on the semiconductor wafer 5 in an etching process.

The method S100 also includes operation S150, in which the semiconductor wafer 5 is unloaded from the wafer chuck 43. In some embodiments, after the completion of the process in the chamber 10, the semiconductor wafer 5 is lifted by the support pins 45, and is removed from the chamber 10 through the robot arm (not shown in figures).

It is understood that the semiconductor wafer fabricated according to the present disclosed methods undergoes further processes. For example, after the semiconductor wafer 5 formed with a thin film is removed from the wafer fabricating system 1, the semiconductor wafer 5 is sent to a chemical-mechanical polishing (CMP) system for a planarization process. It will be appreciated that since the thin films formed on the semiconductor wafer 5 have a higher uniformity as compared with those handled by a conventional wafer chuck, process parameters utilized in the planarization process can be set according to a regular recipe without spending additional time for reworking. As a result, a tool availability of CMP system is increased, and the usage of a slurry in the CMP system is reduced.

The semiconductor wafer 5 may undergo additional processes including material deposition, implantation, or etching operations, to form various features such as field effect transistors, cap insulating layers, contacts/vias, silicide layers, interconnect metal layers, dielectric layers, passivation layers, metallization layers with signal lines, or the like. In some embodiments, one or more layers of conductive, semiconductive, and insulating materials are formed over the substrate, and a pattern is formed in one or more of the layers.

Embodiments of a wafer fabricating system use a wafer chuck to cool the semiconductor wafer. The fluid guiding structure for guiding a heat exchanging medium in the wafer chuck includes a number of arc-shaped channels arranged next to gas inlet ports for receiving helium gas. Since heat accumulated at regions of the wafer chuck around the gas inlet ports can be efficiently removed, a more uniform processing is likely to occur on the semiconductor wafer being processed. According to one experimental result in HDP-CVD process, the film thickness uniformity decreases about 0.8% from 1.57% to 0.78% as compared to semiconductor wafer cooled by a conventional wafer chuck.

In accordance with some embodiments, a method for processing semiconductor wafer is provided. The method includes loading a semiconductor wafer on a top surface of a wafer chuck. The method also includes supplying a gaseous material between the semiconductor wafer and the top surface of the wafer chuck through a first gas inlet port and a second gas inlet port located underneath a fan-shaped sector of the top surface. The method further includes supplying a fluid medium to a fluid inlet port of the wafer chuck and guiding the fluid medium from the fluid inlet port to flow through a number of arc-shaped channels located underneath the fan-shaped sector of the top surface. In addition, the method includes supplying a plasma gas over the semiconductor wafer.

In accordance with some embodiments, a method for processing semiconductor wafer is provided. The method includes loading a semiconductor wafer on a top surface of a wafer chuck. The method also includes supplying a gaseous material between the semiconductor wafer and the top surface of the wafer chuck through a gas inlet port of the wafer chuck. The method further includes supplying a fluid medium to a fluid inlet port of the wafer chuck and guiding the fluid medium from the fluid inlet port to flow through a first arc-shaped channel and a second arc-shaped channel which are located at opposite sides of the gas inlet port. The second arc-shaped channel is located closer to a center of the wafer chuck than the first arc-shaped channel, and the fluid medium from the fluid inlet port flows through the first arc-shaped channel prior to the second arc-shaped channel. In addition, the method includes supplying a plasma gas over the semiconductor wafer.

In some embodiments, a wafer fabricating system includes a wafer chuck, a gas inlet port, a fluid inlet port, first and second arc-shaped channels, a gas source, and a fluid containing source. The wafer chuck has a top surface, and orifices are formed on the top surface. The gas inlet port is formed in the wafer chuck and located underneath a fan-shaped sector of the top surface, wherein the gas inlet port is fluidly communicated with the orifices. The fluid inlet port is formed in the wafer chuck. The first and second arc-shaped channels are fluidly communicated with the fluid inlet port and located underneath the fan-shaped sector of the top surface and located at opposite sides of the gas inlet port from a top view. The gas source fluidly is connected to the gas inlet port. The fluid containing source fluidly is connected to the fluid inlet port. In some embodiments, the first and second arc-shape channels are concentrically arranged relative to a center of the wafer chuck. In some embodiments, the first and second arc-shape channels have arc angles greater than about 180 degrees relative to a center of the wafer chuck. In some embodiments, the second arc-shaped channel has a greater arc angle than the first arc-shaped channel. In some embodiments, the wafer fabricating system further includes a linear connection channel connecting the first arc-shaped channel to the second arc-shaped channel. In some embodiments, the wafer fabricating system further includes a third arc-shaped channel fluidly communicated with the fluid inlet port, wherein the first, second, and third arc-shaped channels are arranged in order along a direction toward a center of the wafer chuck. In some embodiments, the wafer fabricating system further includes a linear connection channel connecting the second arc-shaped channel to the third arc-shaped channel. In some embodiments, the fluid inlet port is located at an outside of the fan-shaped sector of the wafer chuck from the top view. In some embodiments, the wafer fabricating system further includes a fluid outlet port in the wafer chuck and fluidly communicated with the first and second arc-shaped channels, the fluid outlet port being located at an outside of the fan-shaped sector of the wafer chuck. In some embodiments, the wafer fabricating system further includes an inner annular groove formed on the top surface of the wafer chuck and fluidly communicated with the gas inlet port, the inner annular groove overlapping the second arc-shaped channel.

In some embodiments, a wafer fabricating system includes a process chamber, a wafer chuck, a first arc-shaped cooling channel, a second arc-shaped cooling channel, and a fluid containing source. The wafer chuck is in the process chamber. The first arc-shaped cooling channel is disposed in the wafer chuck. The second arc-shaped cooling channel is disposed in the wafer chuck and fluidly communicated with the first arc-shaped cooling channel. The first and second arc-shaped cooling channels are concentric about a center of the wafer chuck from a top view. The fluid containing source fluidly is connected to the first and second arc-shaped cooling channels. In some embodiments, the wafer fabricating system further includes a third arc-shaped cooling channel disposed in the wafer chuck and fluidly communicated with the first and second arc-shaped cooling channels, the first, second, and third arc-shaped cooling channels being concentric about the center of the wafer chuck from the top view. In some embodiments, the wafer fabricating system further includes a first linear connection channel connecting the first arc-shaped cooling channel to the second arc-shaped cooling channel, and a second linear connection channel connecting the second arc-shaped cooling channel to the third arc-shaped cooling channel. In some embodiments, the first linear connection channel has a longer length than the second linear connection channel. In some embodiments, the second arc-shape cooling channel surrounds the first arc-shape cooling channel and has an arc angle greater than about 180 degrees relative to the center of the wafer chuck.

In some embodiments, a wafer fabricating system includes a deposition chamber, a shower head, a wafer chuck, a fluid guiding structure, and a fluid containing source. The shower head is in the deposition chamber. The wafer chuck is in the deposition chamber and below the shower head. The fluid guiding structure is disposed in the wafer chuck. The fluid guiding structure includes a plurality of arc-shaped channels. The arc-shaped channels each have an arc angle greater than about 180 degrees relative to a center of the wafer chuck from a top view. The fluid containing source is fluidly connected to the fluid guiding structure. In some embodiments, a first one of the arc-shaped channel has a greater arc angle than a second one of the arc-shaped channels. In some embodiments, the wafer fabricating system further includes a linear connection channel connecting the first one of the arc-shaped channel to the second one of the arc-shaped cooling channels. In some embodiments, the wafer fabricating system further includes a gas inlet port and a gas source. The gas inlet port is in the wafer chuck and fluidly communicated with orifices formed on the wafer chuck. The gas inlet port is located between the second and third arc-shaped channels from the top view. The gas source is fluidly connected to the gas inlet port. In some embodiments, a third one of the arc-shaped channel has a greater arc angle than the first one of the arc-shaped channels. In some embodiments, the arc-shaped channels are at a same level height.

In some embodiments, a method includes loading a wafer over a wafer chuck in a process chamber; performing a deposition process on the loaded wafer; supplying a fluid medium to a fluid guiding structure in the wafer chuck from a fluid inlet port on the wafer chuck, the fluid guiding structure comprising a plurality of arc-shaped channels fluidly communicated with each other; guiding the fluid medium from a first one of the arc-shaped channels of the fluid guiding structure to a second one of the arc-shaped channels of the fluid guiding structure concentric with the first one of the arc-shaped channels from a top view. In some embodiments, the second one of the arc-shaped channels is located closer to a center of the wafer chuck than the first one of the arc-shaped channels. In some embodiments, the first one of the arc-shaped channels has a greater arc angle than the second one of the arc-shaped channels. In some embodiments, the first and second ones of the arc-shape channels have arc angles greater than about 180 degrees relative to a center of the wafer chuck. In some embodiments, the fluid medium flows through the first and second ones of the arc-shaped channels in opposite circumferential directions around a center of the wafer chuck. In some embodiments, the fluid guiding structure further comprises a linear connection channel connecting the second one of the arc-shaped channels to the first one of the arc-shaped channels. In some embodiments, the fluid medium flows through the first and second ones of the arc-shaped channels in a same circumferential direction around a center of the wafer chuck. In some embodiments, the fluid guiding structure has a third one of the arc-shaped channels between the first and second ones of the arc-shaped channels and concentric with the first and second ones of the arc-shaped channels from the top view. In some embodiments, the fluid medium flows through the first and third ones of the arc-shaped channels in opposite circumferential directions around a center of the wafer chuck. In some embodiments, the method includes guiding a gaseous material from a gas inlet port on a bottom surface of the wafer chuck to an inner annular groove on a top surface of the wafer chuck; supplying the gaseous material between the wafer and the wafer chuck from the inner annular groove.

In some embodiments, a method includes holding a wafer over a wafer chuck in a process chamber; supplying a fluid medium to a fluid inlet port on the wafer chuck; guiding the fluid medium from the fluid inlet port to a first arc-shaped cooling channel disposed in the wafer chuck; after guiding the fluid medium from the fluid inlet port to the first arc-shaped cooling channel, guiding the fluid medium from the first arc-shaped cooling channel to a second arc-shaped cooling channel disposed in the wafer chuck, the fluid medium flowing in a first circumferential direction in the first arc-shaped cooling channel and in a second circumferential direction opposite to the first circumferential direction in the second arc-shaped cooling channel; generating plasma in the process chamber. In some embodiments, the first arc-shaped cooling channel surrounds the fluid inlet port from a top view. In some embodiments, the second arc-shaped cooling channel surrounds the fluid inlet port from a top view. In some embodiments, the method includes discharging the fluid medium through a fluid outlet port on the wafer chuck, wherein the first arc-shaped cooling channel surrounds the fluid outlet port from a top view. In some embodiments, the first arc-shaped cooling channel has a different arc angle than the second arc-shaped cooling channel. In some embodiments, the method includes after guiding the fluid medium from the first arc-shaped cooling channel to the second arc-shaped cooling channel, guiding the fluid medium from the second arc-shaped cooling channel to a third arc-shaped cooling channel disposed in the wafer chuck.

In some embodiments, a method includes depositing a film on a wafer over a wafer chuck in a process chamber; supplying a fluid medium to a first arc-shaped cooling channel disposed in the wafer chuck; guiding the fluid medium from the first arc-shaped cooling channel to a second arc-shaped cooling channel disposed in the wafer chuck, the second arc-shaped channel being closer to a center of the wafer chuck than the first arc-shaped channel from a top view. In some embodiments, guiding the fluid medium from the first arc-shaped cooling channel to the second arc-shaped cooling channel is performed through a first linear connection channel connecting between the first and second arc-shaped cooling channels. In some embodiments, the method includes guiding the fluid medium from the second arc-shaped cooling channel to a third arc-shaped cooling channel disposed in the wafer chuck. In some embodiments, guiding the fluid medium from the second arc-shaped cooling channel to the third arc-shaped cooling channel is performed through a second linear connection channel connecting between the first and second arc-shaped cooling channels, the second linear connection channel having a shorter length than the first linear connection channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   loading a wafer over a wafer chuck in a process chamber;
   performing a deposition process on the loaded wafer;
   supplying a fluid medium to a fluid guiding structure in the wafer chuck from a fluid inlet port on the wafer chuck, the fluid guiding structure comprising a plurality of arc-shaped channels fluidly communicated with each other; and
   guiding the fluid medium from a first one of the arc-shaped channels of the fluid guiding structure to a second one of the arc-shaped channels of the fluid guiding structure, wherein the second one of the arc-shaped channels of the fluid guiding structure is concentric with the first one of the arc-shaped channels from a top view.

2. The method of claim 1, wherein the second one of the arc-shaped channels is located closer to a center of the wafer chuck than the first one of the arc-shaped channels.

3. The method of claim 1, wherein the first one of the arc-shaped channels has a greater arc angle than the second one of the arc-shaped channels.

4. The method of claim 1, wherein the first and second ones of the arc-shape channels have arc angles greater than about 180 degrees relative to a center of the wafer chuck.

5. The method of claim 1, wherein the fluid medium flows through the first and second ones of the arc-shaped channels in opposite circumferential directions around a center of the wafer chuck.

6. The method of claim 1, wherein the fluid guiding structure further comprises a linear connection channel connecting the second one of the arc-shaped channels to the first one of the arc-shaped channels.

7. The method of claim 1, wherein the fluid medium flows through the first and second ones of the arc-shaped channels in a same circumferential direction around a center of the wafer chuck.

8. The method of claim 1, wherein the fluid guiding structure has a third one of the arc-shaped channels between the first and second ones of the arc-shaped channels and concentric with the first and second ones of the arc-shaped channels from the top view.

9. The method of claim 8, wherein the fluid medium flows through the first and third ones of the arc-shaped channels in opposite circumferential directions around a center of the wafer chuck.

10. The method of claim 1, further comprising:
    guiding a gaseous material from a gas inlet port on a bottom surface of the wafer chuck to an inner annular groove on a top surface of the wafer chuck; and supplying the gaseous material between the wafer and the wafer chuck from the inner annular groove.

11. A method, comprising:
holding a wafer over a wafer chuck in a process chamber;
supplying a fluid medium to a fluid inlet port on the wafer chuck,
guiding the fluid medium from the fluid inlet port to a first arc-shaped cooling channel disposed in the wafer chuck;
after guiding the fluid medium from the fluid inlet port to the first arc-shaped cooling channel, guiding the fluid medium from the first arc-shaped cooling channel to a second arc-shaped cooling channel disposed in the wafer chuck, the fluid medium flowing in a first circumferential direction in the first arc-shaped cooling channel and in a second circumferential direction opposite to the first circumferential direction in the second arc-shaped cooling channel; and
generating plasma in the process chamber.

12. The method of claim 11, wherein the first arc-shaped cooling channel surrounds the fluid inlet port from a top view.

13. The method of claim 11, wherein the second arc-shaped cooling channel surrounds the fluid inlet port from a top view.

14. The method of claim 11, further comprising:
discharging the fluid medium through a fluid outlet port on the wafer chuck, wherein the first arc-shaped cooling channel surrounds the fluid outlet port from a top view.

15. The method of claim 11, wherein the first arc-shaped cooling channel has a different arc angle than the second arc-shaped cooling channel.

16. The method of claim 11, further comprising:
after guiding the fluid medium from the first arc-shaped cooling channel to the second arc-shaped cooling channel, guiding the fluid medium from the second arc-shaped cooling channel to a third arc-shaped cooling channel disposed in the wafer chuck.

17. A method, comprising:
depositing a film on a wafer over a wafer chuck in a process chamber;
supplying a fluid medium to a first arc-shaped cooling channel disposed in the wafer chuck; and
guiding the fluid medium from the first arc-shaped cooling channel to a second arc-shaped cooling channel disposed in the wafer chuck, the second arc-shaped cooling channel being closer to a center of the wafer chuck than the first arc-shaped cooling channel from a top view.

18. The method of claim 17, wherein guiding the fluid medium from the first arc-shaped cooling channel to the second arc-shaped cooling channel is performed through a first linear connection channel connecting between the first and second arc-shaped cooling channels.

19. The method of claim 18, further comprising:
guiding the fluid medium from the second arc-shaped cooling channel to a third arc-shaped cooling channel disposed in the wafer chuck.

20. The method of claim 19, wherein guiding the fluid medium from the second arc-shaped cooling channel to the third arc-shaped cooling channel is performed through a second linear connection channel connecting between the first and second arc-shaped cooling channels, the second linear connection channel having a shorter length than the first linear connection channel.

* * * * *